US012683307B2

(12) United States Patent
Lee

(10) Patent No.: US 12,683,307 B2
(45) Date of Patent: Jul. 14, 2026

(54) CONNECTING SYSTEM AND ELECTRICAL CONNECTOR FOR CHIP MODULE

(71) Applicant: Foxconn Interconnect Technology Limited, Grand Cayman (KY)

(72) Inventor: Chia-Yen Lee, New Taipei City (TW)

(73) Assignee: Foxconn Interconnect Technology Limited, Grand Cayman (KY)

( * ) Notice: Subject to any disclaimer, the term of this patent is extended or adjusted under 35 U.S.C. 154(b) by 372 days.

(21) Appl. No.: 18/531,616

(22) Filed: Dec. 6, 2023

(65) Prior Publication Data

US 2024/0356254 A1 Oct. 24, 2024

(30) Foreign Application Priority Data

Apr. 20, 2023 (CN) .......................... 202310430788.9

(51) Int. Cl.
| | |
|---|---|
| *H01R 12/70* | (2011.01) |
| *H01R 12/71* | (2011.01) |
| *H01R 13/631* | (2006.01) |
| *H10W 72/00* | (2026.01) |

(52) U.S. Cl.
CPC ....... *H01R 12/7076* (2013.01); *H01R 12/714* (2013.01); *H01R 13/631* (2013.01); *H10W 72/00* (2026.01)

(58) Field of Classification Search
CPC .. H01R 12/7076; H01R 12/70; H01R 12/714; H01R 12/71; H01R 12/75; H01R 13/631; H01R 13/40; H01R 13/502; H10W 72/00; H10W 72/012; H10W 72/552; H10W 72/016

See application file for complete search history.

(56) References Cited

U.S. PATENT DOCUMENTS

| | | | | |
|---|---|---|---|---|
| 8,740,643 | B2 * | 6/2014 | Kuang ................. | H01R 13/514 |
| | | | | 439/541.5 |
| 9,735,495 | B2 * | 8/2017 | Gross ................. | H01R 13/5208 |
| 11,588,262 | B2 | 2/2023 | Mongold et al. | |
| 11,637,404 | B2 | 4/2023 | Mongold et al. | |
| 2008/0160815 | A1 * | 7/2008 | Ju ......................... | H05K 7/1061 |
| | | | | 439/331 |
| 2018/0323523 | A1 * | 11/2018 | Hsu ...................... | H01R 12/714 |
| 2021/0265785 | A1 * | 8/2021 | Mongold ........... | H01R 13/6587 |
| 2021/0305740 | A1 * | 9/2021 | Mongold .............. | H01R 12/79 |
| 2023/0335960 | A1 | 10/2023 | Gore et al. | |

* cited by examiner

*Primary Examiner* — Nikolay K Yushin
(74) *Attorney, Agent, or Firm* — Li & Cai Intellectual Property Office

(57) ABSTRACT

A connecting system and an electrical connector for a chip module are provided. The connecting system includes the chip module and the electrical connector. The chip module includes a chip substrate. The chip substrate has a plurality of first conductive pads arranged in a matrix manner. The electrical connector includes a first output end and a second output end. The first output end is configured to connect with a plurality of external cables, and the second output end has a plurality of conductive contact parts arranged in the matrix manner. The second output end of the electrical connector is disposed face-to-face with the chip module. The conductive contact parts are electrically connected to the first conductive pads of the chip substrate.

11 Claims, 8 Drawing Sheets

CONNECTING SYSTEM AND ELECTRICAL CONNECTOR FOR CHIP MODULE

CROSS-REFERENCE TO RELATED PATENT APPLICATION

This application claims the benefit of priority to China Patent Application No. 202310430788.9, filed on Apr. 20, 2023, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a connecting system and an electrical connector for a chip module, and more particularly to a connecting system for a chip module in which the connecting system has an electrical board architecture with a separate-type chip module, the electrical connector is connected to a signal part of the chip module, and a power of the chip module is connected to a main circuit board.

BACKGROUND OF THE DISCLOSURE

In a conventional computer, a main circuit board is required for input and output of a central processing unit (CPU), and stacked layers of the main circuit board can be increased due to design requirements of electronic circuits. The main circuit board of a complex electrical apparatus may have dozens of stacked layers.

The design of stacked electronic circuits may be affected by complex circuitry around a periphery of the CPU, such that a manufacturing process of the main circuit board is complex, a production yield is low, and a processing time is prolonged.

For the main circuit board, the layout of electronic components (such as connectors, arrangements for heat-dissipation, and a power supplier) may affect the cutting efficiency thereof, thereby causing waste. Taking an area of the main circuit board into consideration, the connectors are arranged at sides of the main circuit board. However, such arrangement can lead to lengthening of wires, which will affect the transmission efficiency and increase the costs of the wires.

Therefore, how to overcome the above-mentioned problems through an improvement in electrical board architecture of the chip module, so as to reduce the costs of the main circuit board and the wires and increase the transmission efficiency, has become one of the important issues to be solved in this industry.

SUMMARY OF THE DISCLOSURE

In response to the above-referenced technical inadequacies, the present disclosure provides an electrical connector and a connecting system for a chip module, so as to improve an electrical board architecture of the chip module, reduce the costs of a main circuit board and wires, and increase the transmission efficiency.

In order to solve the above-mentioned problems, one of the technical aspects adopted by the present disclosure is to provide an electrical connector, which includes a main body, a plurality of conductive terminals, and a plurality of external cables. The main body has a first output end and a second output end. The first output end is configured to have a multi-layer stepped shape. The second output end is configured to directly face a chip module. The plurality of conductive terminals are received in the main body. Each of the plurality of conductive terminals has a connecting portion exposed outside of the first output end of the main body, and a conductive contact part exposed outside of the second output end of the main body. The conductive contact parts are configured to correspondingly connect with a plurality of conductive pads of the chip module. The plurality of external cables are correspondingly disposed on the second output end of the main body, and connect to the connecting portions of the plurality of conductive terminals.

In order to solve the above-mentioned problems, another one of the technical aspects adopted by the present disclosure is to provide a connecting system for a chip module, which includes the chip module and an electrical connector. The chip module includes a chip substrate. The chip substrate has a plurality of first conductive pads arranged in a matrix manner. The electrical connector includes a first output end and a second output end. The first output end is configured to connect a plurality of external cables, and a second output end has a plurality of conductive contact parts arranged in a matrix manner. The second output end of the electrical connector is disposed face-to-face with the chip module, and the conductive contact parts are electrically connected to the first conductive pads of the chip substrate.

Therefore, in the electrical connector and the connecting system for the chip module provided by the present disclosure, by virtue of a signal part of the chip module being connected to an external component through the external cables, the quantity of inner stacked layers of the main circuit board can be reduced. In addition, the first output end of the electrical connector of the chip module is configured to have a multi-layer stepped shape, so that the external cables can extend evenly in the same direction like a fan shape. Accordingly, an improved signal transmission effect can be achieved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
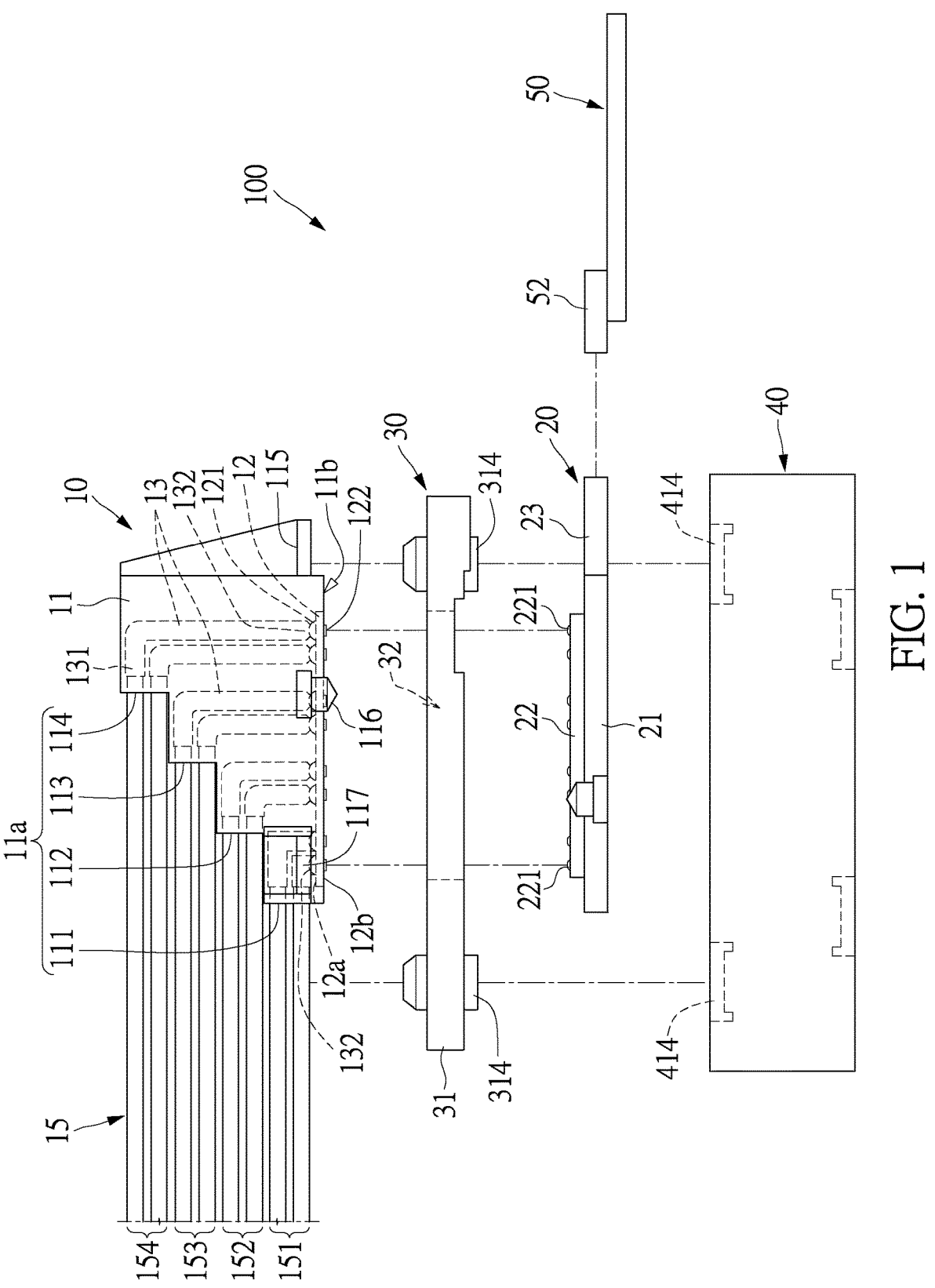
FIG. 1 is a schematic exploded side view of a connecting system for a chip module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
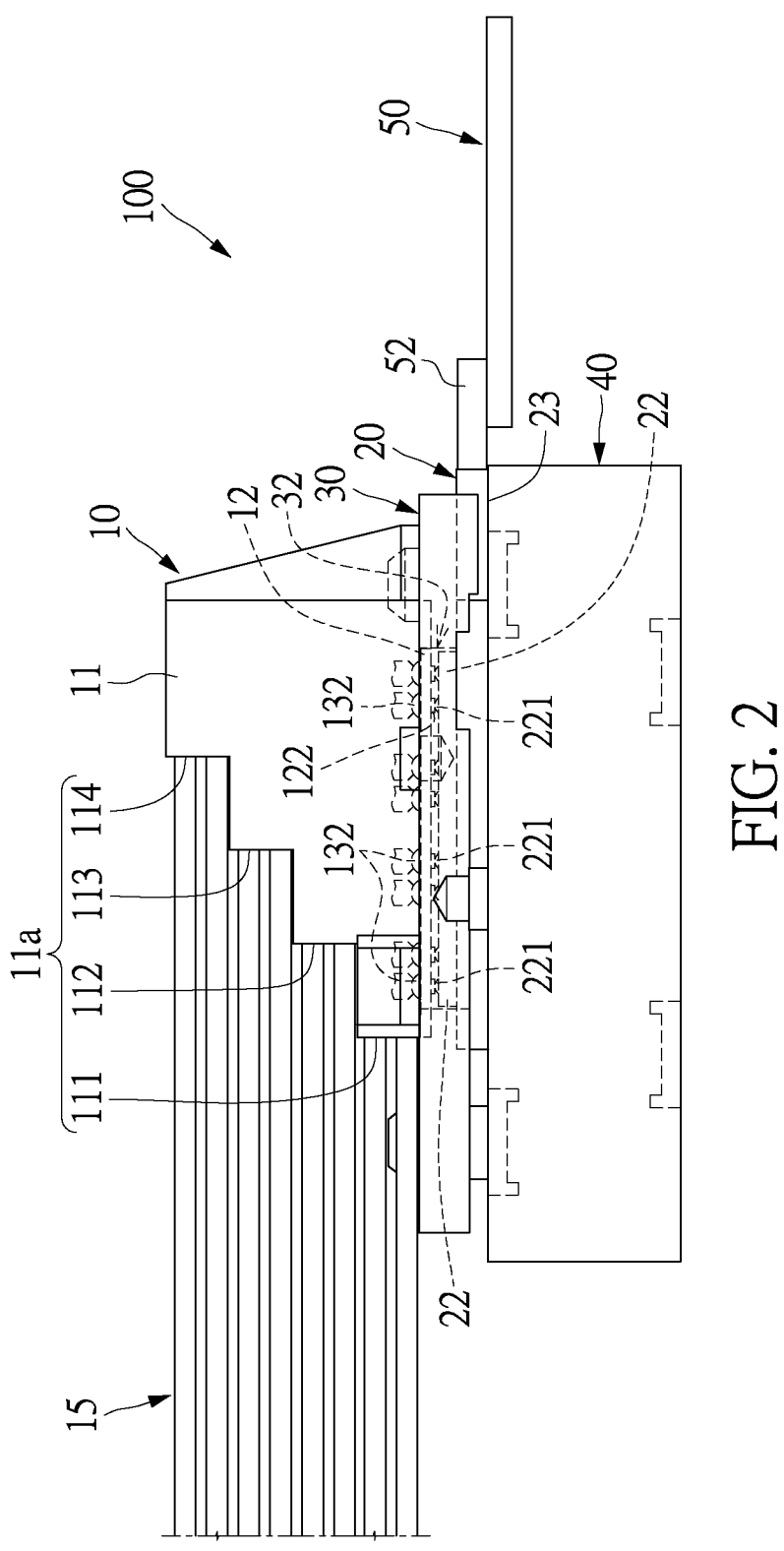
FIG. 2 is a schematic exploded side view of the connecting system for the chip module of the present disclosure.

Referring to FIG. 1 and FIG. 2, a first embodiment of the present disclosure provides a connecting system 100 for a chip module. The connecting system 100 is connected between a chip module 20 and a main circuit board 50. The connecting system 100 includes an electrical connector 10, a fixing frame 30, and a cooling device 40. As shown in FIG. 1, in this embodiment, the electrical connector 10, the fixing frame 30, the chip module 20, and the cooling device 40 are sequentially arranged from top to bottom.

Figure 3:
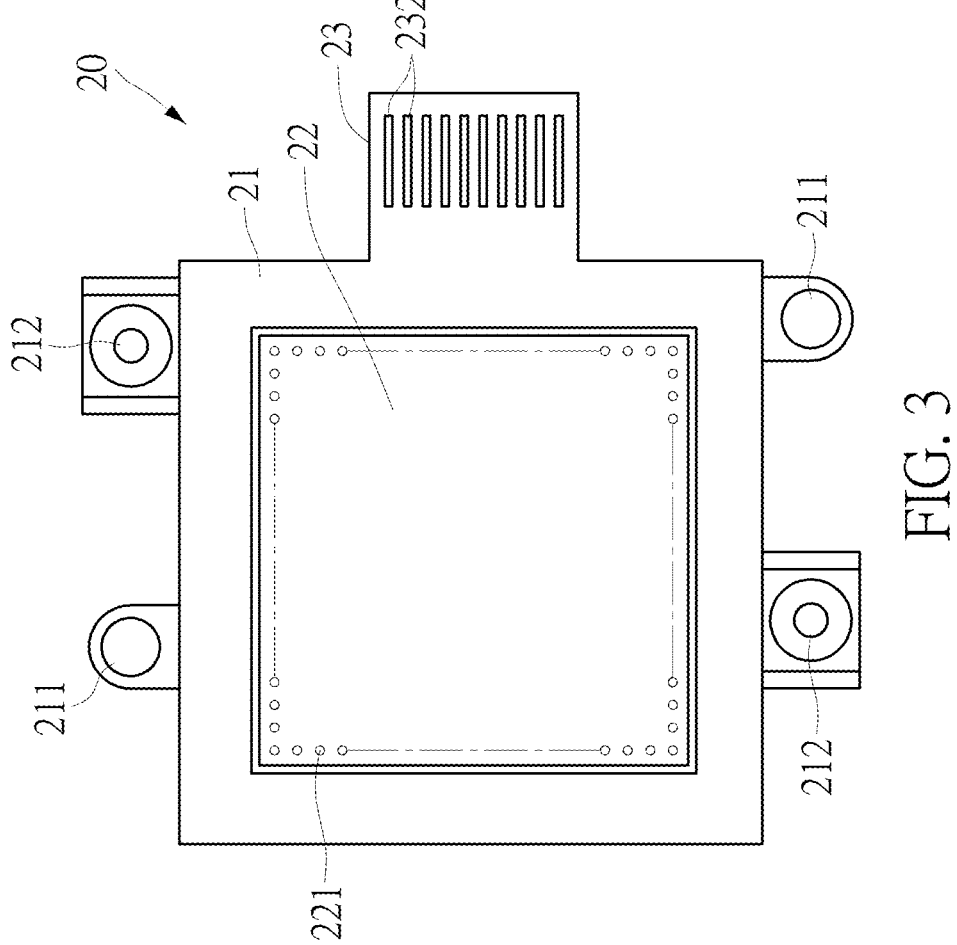
FIG. 3 is a top view of the chip module of the present disclosure.

Specifically, the chip module 20 is an integrated circuit chip, which has a chip circuit board 21, an input-output area 22, and a protruding portion 23 (as shown in FIG. 3). The chip circuit board 21 is an additional circuit board of the chip module 20. The input-output area 22 is disposed on a surface of the chip circuit board 21, and has a plurality of first conductive pads 221. The protruding portion 23 extends from one side of the chip circuit board 21, and both form a chip substrate. The protruding portion 23 has a plurality of second conductive pads 232 (otherwise referred to as golden fingers), which are arranged in one row or two rows. For example, in this embodiment, the chip module 20 is an application-specific integrated circuit (ASIC). The ASIC refers to an integrated circuit of special specification that is customized according to different product requirements. The integrated circuit technology of the ASIC can be closely combined with a specific user's machine or system technology, and is different from a common integrated circuit (otherwise referred to as a common central processing unit (CPU)). However, the present disclosure is not limited thereto.

Referring to FIG. 1 and FIG. 2, one characteristic of the present disclosure is that the chip module 20 is reversely disposed. In addition, the main circuit board 50 is disposed on one side of the chip module 20. The main circuit board 50 has a bus connector 52. The protruding portion 23 of the chip module 20 is inserted in the bus connector 52 of the main circuit board 50. Different from the conventional technology, the chip module 20 of this embodiment is not disposed on a surface of the main circuit board 50. The input-output area 22 of the chip module 20 is turned away from the main circuit board 50, and faces toward the electrical connector 10. In this embodiment, the chip module 20 is connected with other elements (not shown) through a plurality of external cables 15 of the electrical connector 10. Therefore, an inner stacked structure of the main circuit board 50 can be simplified, so as to reduce the costs of the main circuit board 50, and improve a production yield of the main circuit board 50.

The fixing frame 30 is disposed between the electrical connector 10 and the fixing frame 30, so as to orientate the chip module 20 to accurately mate with the electrical connector 10. The chip module 20 is disposed on one side of the fixing frame 30. Specifically, as shown in FIG. 1, the chip module 20 of this embodiment is disposed under the fixing frame 30.

The cooling device 40 is disposed on one side of the chip module 20. The chip module 20 is fixedly disposed between the fixing frame 30 and the cooling device 40. Specifically, as shown in FIG. 1, the cooling device 40 of this embodiment is disposed under the chip module 20. The cooling device 40 is separate from the main circuit board 50.

One characteristic of the present disclosure is that the electrical connector 10 is provided. The electrical connector 10 is disposed on the other side of the fixing frame 30, and is opposite to the chip module 20. The electrical connector 10 is designed in a three-dimensional manner. That is, an external connecting interface of the electrical connector 10 is designed to have a multi-layer structure. The electrical connector 10 will be described in detail below.

Referring to FIG. 1, FIG. 2, FIG. 4 and FIG. 5, details of the electrical connector of the chip module in the present disclosure are as follows. The electrical connector 10 includes a main body 11, an adapter board 12, a plurality of conductive terminals 13, and the plurality of external cables 15. As shown in FIG. 1, the main body 11 has a first output end 11*a* and a second output end 11*b*. The first output end 11*a* is designed to have a multi-layer stepped shape. The second output end 11*b* directly faces the chip module 20. In this embodiment, the first output end 11*a* includes a plurality of output ports (111, 112, 113, 114). The plurality of output ports (111, 112, 113, 114) are arranged to have a multi-layer stepped shape, and are staggered from each other. Specifically, from a side view (as shown in FIG. 1), the plurality of output ports (111, 112, 113, 114) form a stepped shape. In addition, referring to FIG. 2, the plurality of output ports (111, 112, 113, 114) are formed in a stepped shape, and orientate toward the same direction (i.e., a left side of FIG.

1). A cross-sectional area of the output port 111 that is at the bottom is larger than a cross-sectional area of any one of the output ports (112, 113, 114) that is distant from the adapter board 12. The above-mentioned cross-sectional area refers to a transverse cross-sectional area that is parallel to the main circuit board 50.

Figure 4:
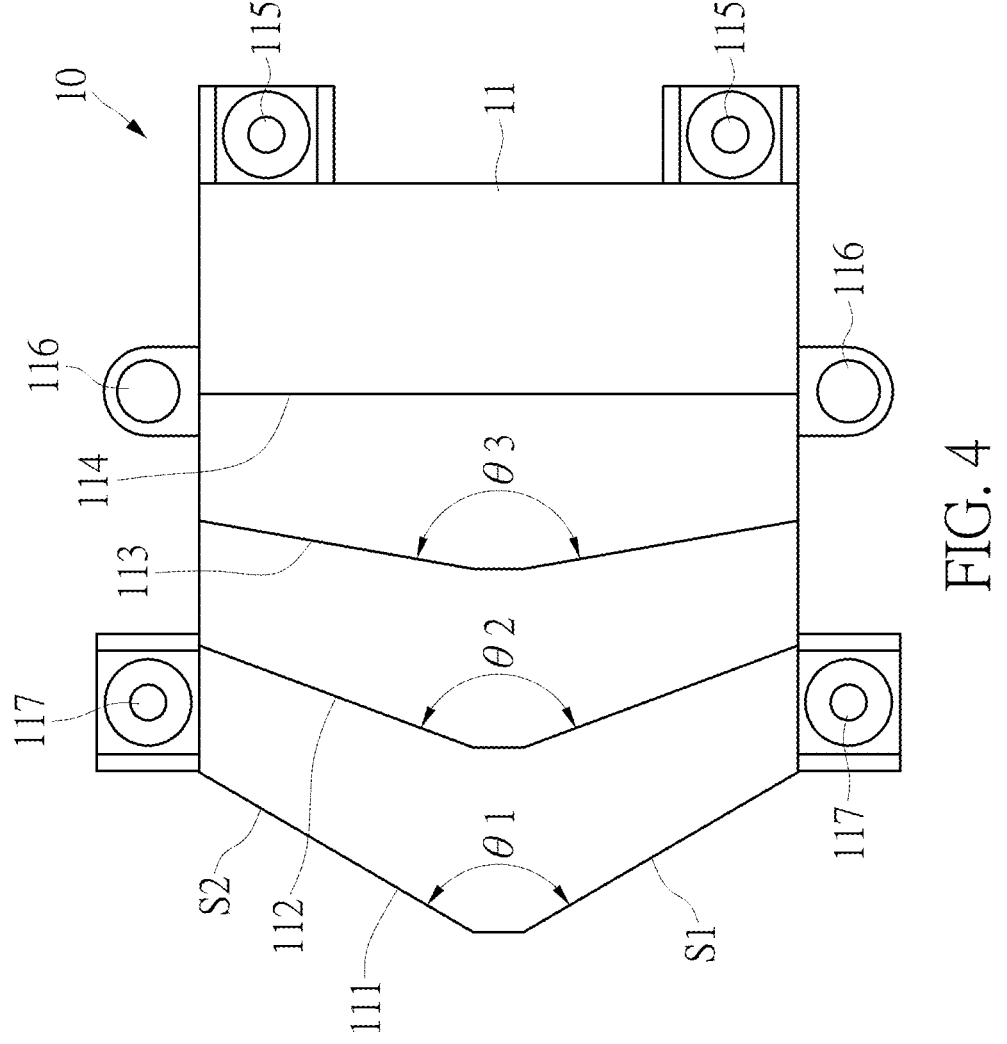
FIG. 4 is a top view of an electrical connector for the chip module of the present disclosure.

Reference is made to FIG. 4. It should be noted that, in this embodiment, the output port (111, 112, 113, 114) of each step has a different slanted surface. For example, the output port 111 is adjacent to the adapter board 12, and the output port 111 is configured to have a first output interface S1 and a second output interface S2. A first obtuse angle θ1 is formed between the first output interface S1 and the second output interface S2. A second one of the output ports (112) from bottom to top has two output interfaces, and a second obtuse angle θ2 formed between these two output interfaces is smaller than the first obtuse angle θ1 of the output port 111. A third one of the output ports (113) from bottom to top has a third obtuse angle θ3 that is smaller than the second obtuse angle θ2 of the output port 112. An output interface of the output port 114 that is at the top is planar.

Figure 5:
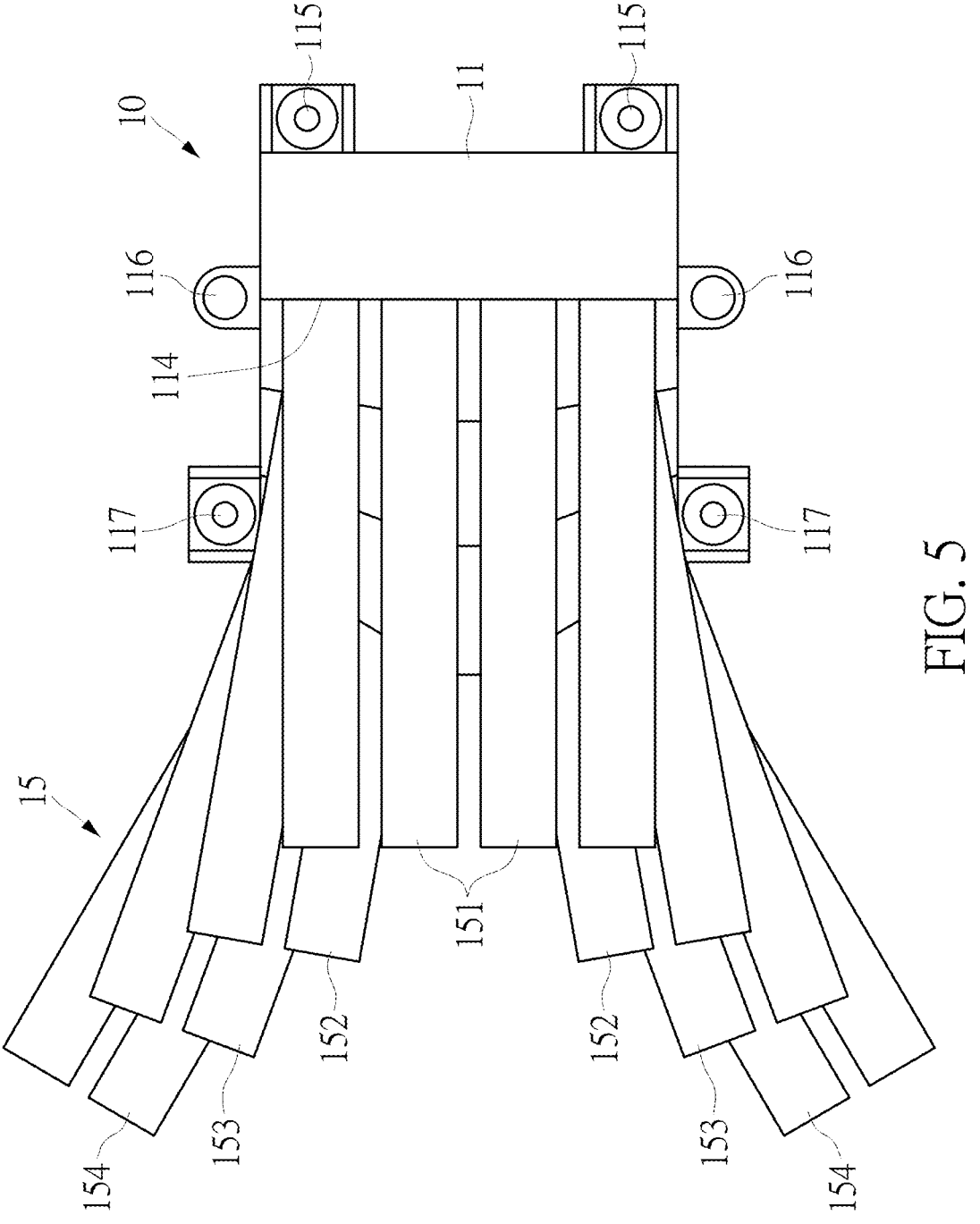
FIG. 5 is a top view of the electrical connector for the chip module and an external cable of the present disclosure.

Referring to FIG. 1 and FIG. 5, one characteristic of the present disclosure is to arrange wires of the electrical connector 10 in a three-dimensional manner, so that wire outlet directions can be consistent. In detail, the external cables 15 are respectively and electrically connected to other ends of the plurality of conductive terminals 13. Terminal ends of the external cables 15 are connected to an external connector (not shown). The external cables 15 can be a flexible flat cable. The external cables 15 can be divided into a first cable 151, a second cable 152, a third cable 153, and a fourth cable 154. In this embodiment, different included angles are formed by the plurality of output interfaces, and advantages thereof are as follows. The output ports (111, 112, 113, 114) are respectively connected to the first cable 151, the second cable 152, the third cable 153, and the fourth cable 154. The external cables 15 can extend outwardly and evenly like a fan shape, so as to connect to other electronic elements (not shown). In addition, since the plurality of output ports (111, 112, 113, 114) are stepped-shaped and orientated toward the same direction, the external cables 15 also extend in one direction (that is, a direction away from the main circuit board 50). In comparison, if all of the external cables are arranged on the same plane, some external cables may need to be bent, thereby resulting in a longer length (which is likely to affect the transmission efficiency of a signal). The external cables of this embodiment extend evenly in the same direction like a fan shape, and do not have much difference in length, such that a better signal transmission effect can be achieved.

The adapter board 12 is received in the main body 11 and adjacent to a bottom portion of the main body 11. An area of the adapter board 12 is smaller than or equal to an area of the chip module 20. In other words, the area of the adapter board 12 is approximately equal to an area of the input-output area 22 of the chip module 20. The adapter board 12 has an upper surface 12a and a lower surface 12b. In this embodiment, the lower surface 12b refers to a surface facing the chip module 20. The upper surface 12a has a plurality of upper contacts 121. The lower surface 12b has a plurality of lower contacts 122. Through an internal part of the adapter board 12, the plurality of upper contacts 121 are correspondingly and electrically connected to the lower contacts 122. The lower contacts 122 are exposed outside of the main body 11, and are fitted for contacting the first conductive pads 221 of the chip module 20. It is worth mentioning that signal parts of the chip module 20 are electrically connected to the adapter board 12 (e.g., through the first conductive pads 221). Power parts and basic control signal parts of the chip module 20 are electrically connected to the main circuit board 50 (e.g., through the second conductive pads 232 of the protruding portion 23).

The conductive terminals 13 are substantially L-shaped and received in the main body 11. A bottom end of each of the conductive terminals 13 has a conductive contact part 132 that is exposed to the second output end 11b of the main body 11. The conductive contact parts 132 are electrically connected to the upper contacts 121 of the adapter board 12, and a connection method thereof can be elastic contacting or soldering. However, the present disclosure is not limited thereto. A top end of each conductive terminal 13 has a connecting portion 131, which is exposed outside of the first output end 11a of the main body 11. The connecting portions 131 respectively extend to the output ports (111, 112, 113, 114). For example, the conductive contact part 132 of the conductive terminal 13 can be configured into a soldering structure, so as to be soldered to the upper contact 121 of the adapter board 12. The connecting portion 131 of the conductive terminal 13 can be pin-shaped. The external cable 15 can be connected to the top end of the conductive terminal 13 by a connector. However, the present disclosure is not limited thereto.

Furthermore, the conductive terminals 13 of this embodiment can be fixed in the main body 11 by an insert-molding process, or the conductive terminals 13 are first fixed in an additional insulator to form a terminal board, and two ends of the conductive terminals 13 are respectively exposed outside of two sides of the insulator. Then, the terminal board is assembled in the main body 11. However, the present disclosure is not limited thereto. For example, an assembly process can also be adopted.

Figure 6:
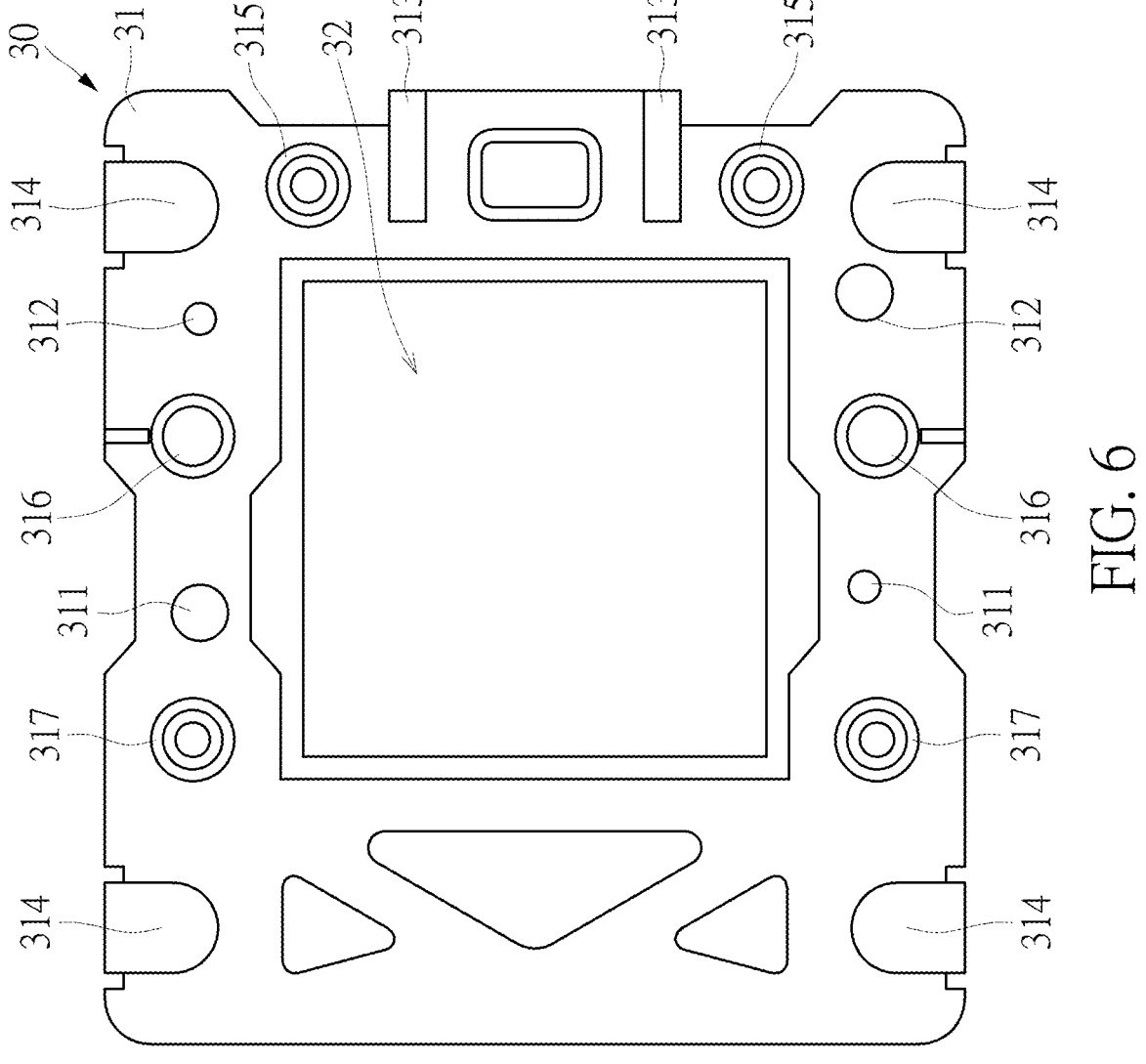
FIG. 6 is a top view of a fixing frame of the present disclosure.

Referring to FIG. 6, one characteristic of the present disclosure is that the fixing frame 30 supports the electrical connector 10 and the chip module 20, and provides precise positioning. Specifically, the fixing frame 30 includes a frame body 31 and an engraved portion 32. The engraved portion 32 is formed on the frame body 31. The input-output area 22 of the chip module 20 passes through the engraved portion 32, and is orientated toward the adapter board 12 of the electrical connector 10. In addition, the fixing frame 30 of this embodiment further includes a pair of limiting walls 313. The chip module 20 has the protruding portion 23, and the protruding portion 23 is disposed between the pair of limiting walls 313.

Furthermore, the connecting system 100 for the chip module has positioning and locking mechanisms between the elements. For example, as shown in FIG. 3, the chip circuit board 21 of the chip module 20 has two sides, and each of which has a first chip positioning member 211 and a second chip positioning member 212. In this embodiment, the first chip positioning member 211 is a protruding column structure, and the second chip positioning member 212 is a hole structure. Referring to FIG. 6, the fixing frame 30 has a corresponding arrangement, in which the frame body 31 has a first frame positioning member 311 and a second frame positioning member 312 at each of two sides of the engraved portion 32. The first frame positioning member 311 is a hole structure that corresponds to the first chip positioning member 211. The second frame positioning member 312 is a protruding column structure that corresponds to the second chip positioning member 212.

Referring to FIG. 6, the frame body 31 of the fixing frame 30 further includes a pair of third frame positioning members 315, a pair of fourth frame positioning members 316, and a pair of fifth frame positioning members 317, which correspond to a plurality of fixing portions disposed on the bottom portion of the main body 11 of the electrical connector 10 (as shown in FIG. 4). The plurality of fixing portions include a pair of third fixing portions 115, a pair of fourth fixing portions 116, and a pair of fifth fixing portions 117. The third fixing portions 115 and the fifth fixing portions 117 are hole structures that correspond to protruding column structures of the third frame positioning members 315 and the fifth frame positioning members 317. Protruding column structures of the fourth fixing portions 116 correspond to hole structures of the fourth frame positioning members 316. However, the present disclosure is not limited thereto. The protruding column structure and the hole structure mentioned above are interchangeable.

Figure 7:
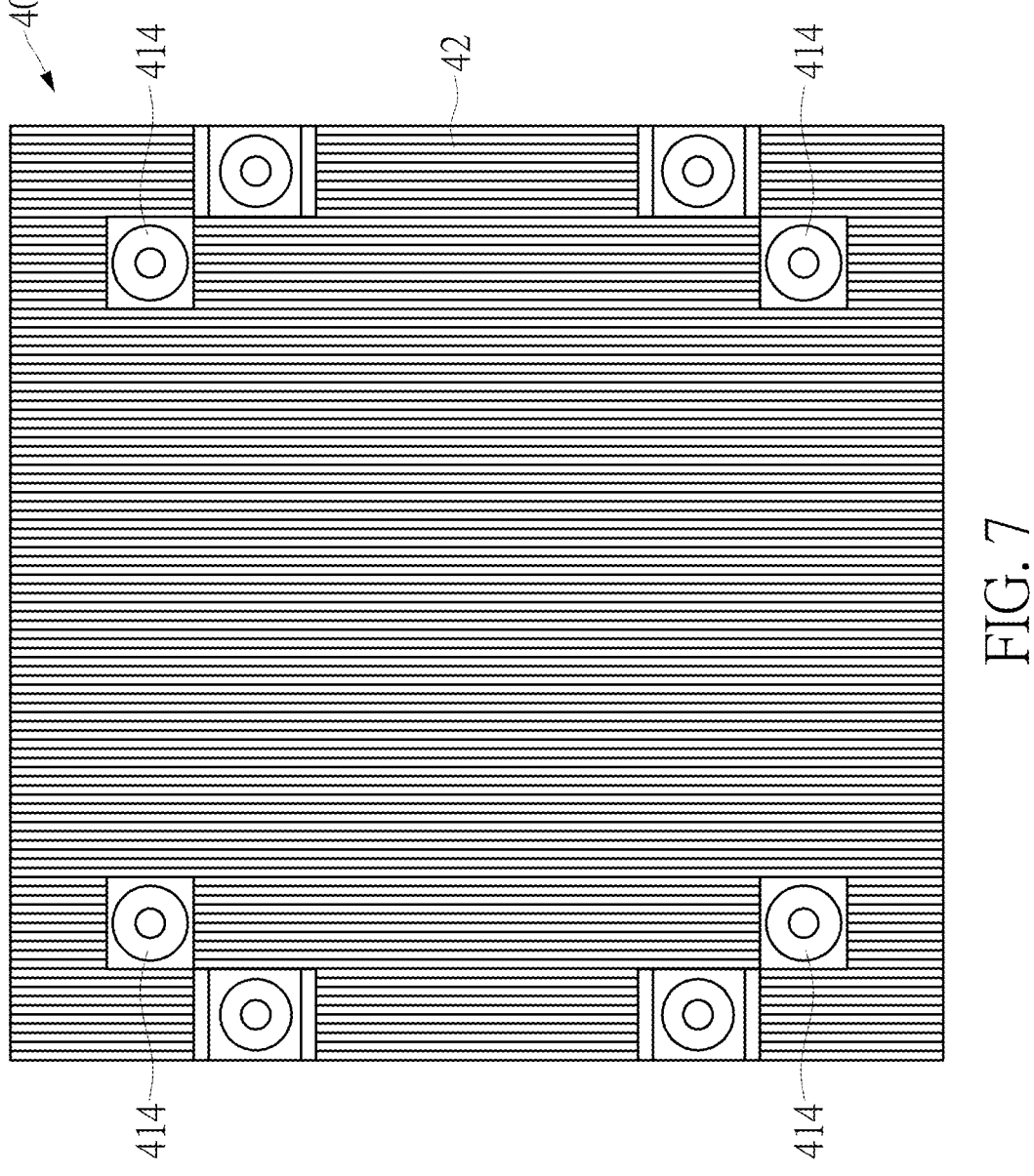
FIG. 7 is a top view of a cooling device of the present disclosure.

Referring to FIG. 7, a top view of the cooling device 40 of the present disclosure is illustrated. The cooling device 40 is fixed under the fixing frame 30. The cooling device 40 abuts against the chip module 20 to provide a heat-dissipation function. In terms of the positioning structure, a plurality of cooling device positioning members 414 are disposed at a periphery of the cooling device 4, which correspond to sixth frame positioning members 314 of the fixing frame 30 (as shown in FIG. 6). The cooling device 40 has a plurality of cooling fins 42 that are downwardly disposed.

Second Embodiment

Figure 8:
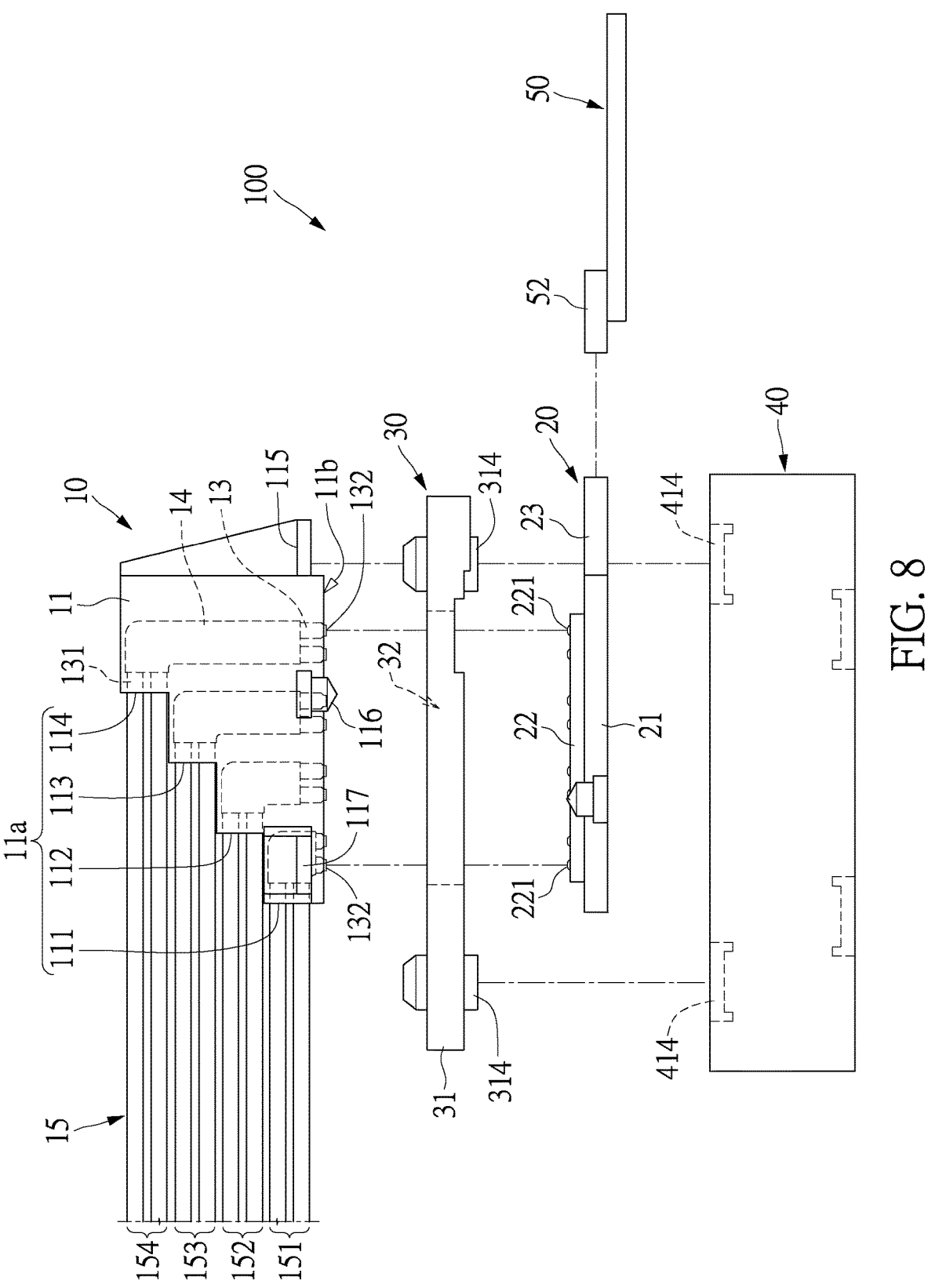
FIG. 8 is a schematic exploded side view of the connecting system for the chip module according to a second embodiment of the present disclosure.

Reference is made to FIG. 8. In the present disclosure, a main difference between a second embodiment and the first embodiment is that the adapter board 12 is omitted in the second embodiment. The conductive contact parts 132 on the bottom ends of the conductive terminals 13 of this embodiment are exposed to the second output end 11 of the main body 11. The conductive contact parts 132 can directly abut against the first conductive pads 221 on a top surface of the chip module 20. The first conductive pad 221 can be a conductive pad or a pin-shaped contact. The conductive contact part 132 can be a contacting portion with elasticity or a conductive pad.

In this embodiment, the two conductive terminals 13 are firstly fixed in an insulator 14, so as to form a terminal board. Two ends of the conductive terminal 13 are exposed to two sides of the insulator 14, respectively. In other words, the connecting portions 131 on the top ends of the conductive terminals 13 are exposed to one side of a top portion of the insulator 14. The conductive contact parts 132 on the bottom ends of the conductive terminals 13 are exposed to a bottom portion of the insulator 14. Then, the terminal board is assembled in the main body 11.

Beneficial Effects of the Embodiments

In conclusion, in the electrical connector and the connecting system for the chip module provided by the present disclosure, by virtue of the signal part of the chip module being connected to an external component through the external cables, the quantity of inner stacked layers of the main circuit board can be reduced.

The output ports of the electrical connector for the chip module are arranged in multi-layers and orientated toward the same direction, so that the external cables can extend evenly in one direction like a fan shape. Accordingly, an improved signal transmission effect can be achieved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electrical connector, comprising:
a main body having a first output end and a second output end, the first output end being configured to have a multi-layer stepped shape, and the second output end being configured to directly face a chip module;
a plurality of conductive terminals received in the main body, each of the plurality of conductive terminals having a connecting portion exposed outside of the first output end of the main body, and a conductive contact part exposed outside of the second output end of the main body; wherein the conductive contact parts are configured to correspondingly connect with a plurality of conductive pads of the chip module; and
a plurality of external cables correspondingly disposed on the first output end of the main body, and connecting to the connecting portions of the plurality of conductive terminals.

2. The electrical connector according to claim 1, wherein a plurality of fixing portions are formed on a bottom portion of the main body.

3. The electrical connector according to claim 1, further comprising an adapter board, wherein the adapter board is received in the main body and adjacent to a bottom portion of the main body, the adapter board has an upper surface and a lower surface, the upper surface includes a plurality of upper contacts, the lower surface includes a plurality of lower contacts, the plurality of upper contacts are respectively and electrically connected to the plurality of lower contacts, the connecting portions of the plurality of conductive terminals are electrically connected to the plurality of upper contacts of the adapter board, and the plurality of lower contacts are exposed outside of the main body and are configured to contact the conductive pads of the chip module.

4. The electrical connector according to claim 3, wherein an area of the adapter board is smaller than or equal to an area of the chip module.

5. The electrical connector according to claim 3, wherein the plurality of lower contacts of the adapter board are electrically connected to a plurality of signal terminals of the chip module.

6. The electrical connector according to claim 3, wherein the first output end has a plurality of output ports, the plurality of output ports are formed to have a stepped shape and face toward a same direction, and a cross-sectional area of one of the output ports that is adjacent to the adapter board is larger than a cross-sectional area of one of the output ports that is distant from the adapter board.

7. The electrical connector according to claim 6, wherein the output port has a first output interface and a second output interface, and an obtuse angle is formed between the first output interface and the second output interface.

8. A connecting system, comprising:

a chip module including a chip substrate, the chip substrate having a plurality of first conductive pads arranged in a matrix manner; and an electrical connector including:

a first output end being configured to connect with a plurality of external cables; and a second output end having a plurality of conductive contact parts arranged in the matrix manner;

wherein the second output end of the electrical connector is disposed face-to-face with the chip module, and the conductive contact parts are electrically connected to the first conductive pads of the chip substrate.

9. The connecting system according to claim 8, wherein one end of the chip module has a protruding portion, and the protruding portion has a plurality of second conductive pads that are arranged in one row or two rows.

10. The connecting system according to claim 8, further comprising a fixing frame, wherein the chip module and the electrical connector are fixed to the fixing frame, and the electrical connector and the chip module are oppositely disposed on two sides of the fixing frame.

11. The connecting system according to claim 8, further comprising a cooling device, wherein the cooling device is disposed on the chip module, and the cooling device and the electrical connector are respectively disposed on two opposite sides of the chip module.

*   *   *   *   *